United States Patent

Komatsu et al.

[11] Patent Number: 5,818,217
[45] Date of Patent: Oct. 6, 1998

[54] ELECTRON BEAM IRRADIATING APPARATUS AND ELECTRIC SIGNAL DETECTING APPARATUS

[75] Inventors: Fumio Komatsu, Fuchu; Katsuya Okumura, Yokohama; Motosuke Miyoshi, Tokyo-To, all of Japan

[73] Assignee: Kabushiki Kaisha Toshiba, Kawasaki, Japan

[21] Appl. No.: 222,392

[22] Filed: Apr. 4, 1994

Related U.S. Application Data

[62] Division of Ser. No. 983,229, Nov. 30, 1992, Pat. No. 5,315,119.

[30] Foreign Application Priority Data

Nov. 29, 1991 [JP] Japan .................................. 3-316861

[51] Int. Cl.$^6$ .................................................. G01R 31/305
[52] U.S. Cl. ........................................ 324/158.1; 324/751
[58] Field of Search ............................... 324/158.1, 73.1, 324/751, 500, 501; 250/310, 311, 398, 396

[56] References Cited

U.S. PATENT DOCUMENTS

| | | |
|---|---|---|
| 3,278,846 | 10/1966 | Patten et al. . |
| 3,629,714 | 12/1971 | Earp . |
| 3,795,861 | 3/1974 | Lazenby et al. . |
| 3,843,926 | 10/1974 | Espenlaub et al. . |
| 4,825,103 | 4/1989 | Hornak . |
| 4,833,445 | 5/1989 | Buchele . |
| 4,896,109 | 1/1990 | Rauscher . |
| 4,933,634 | 6/1990 | Cuzin et al. . |
| 5,103,101 | 4/1992 | Berglund et al. ....................... 250/398 |

OTHER PUBLICATIONS

Kleinfelder, S.A.; "Development of a Switched capacitor. . . ", IEEE Transactions on Nuclear Science; vol. 35; No. 1; Feb. 1988; 34$^{th}$ Nucl. Sci. Symp., San Francisco, CA Oct. 21–23, 1987; pp. 151–154.

*Primary Examiner*—Ernest F. Karlsen
*Attorney, Agent, or Firm*—Foley & Lardner

[57] ABSTRACT

To prevent electric charge up from being accumulated on the plane scanned by an electron beam and further to improve the S/N ratio, an electron beam irradiating apparatus comprising: position information signal outputting section for outputting position information signals, in sequence to designate positions at which an electron beam is irradiated on a plane scanned by the electron beam, so as to designate the irradiation positions at random; and irradiation controller for-controlling the electron beam to irradiate the electron beam at the irradiation positions in response to the outputted position information signals. Further, to integrate an photoelectric signal over a sufficient time interval within the period of the pixel clock signal, the electric signal detecting circuit comprises a plurality of sample hold circuits and a selecting circuit for selecting and activating the sample hold circuits in sequence.

6 Claims, 3 Drawing Sheets

ELECTRON BEAM IRRADIATING APPARATUS AND ELECTRIC SIGNAL DETECTING APPARATUS

This application is a divisional of application Ser. No. 07/983,229, filed Nov. 30, 1992, now U.S. Pat. No. 5,315,119.

BACKGROUND OF THE INVENTION

1. Field of the Invention

The present invention relates to an electron beam irradiating apparatus, and specifically to an electron beam irradiating apparatus which can irradiate an electron beam upon a plane scanned by an electron beam, by designating electron beam irradiation positions. Further, the present invention relates to an electric signal detecting apparatus incorporated in the electron beam irradiating apparatus, and more specifically to the detecting apparatus for generating a video signal in response to a photoelectric signal generated by the electron beam irradiating apparatus.

2. Description of the Prior Art

In the semiconductor manufacturing process for instance, the microstructure of a semiconductor sample is observed with the use of an electron beam irradiating apparatus such as an electron microscope, for instance.

In the prior art electron beam irradiating apparatus, a saw-tooth waveform signal referred to as a horizontal scanning signal and a vertical scanning signal is applied to a scanning coil to scan irradiation positions on a scanning plane in sequence continuously. Further, a horizontal blanking signal is applied to the scanning coil to return the electron beam to the start position for each scanning line. Additionally, whenever all the scanning operation ends once on one scanning plane, a vertical blanking signal is applied to the scanning coil, so that the same area can be irradiated with the electron beam repeatedly.

In the case where the semiconductor sample is observed in the semiconductor manufacturing process, the surface of the semiconductor sample is usually formed of an insulating substance such as photoresist. Therefore, when the sample as described above is continuously irradiated with the electron beam of the prior art electron microscope, there arises a problem in that the sample is charged up electrically because the conductive path of the irradiated electrons is small and narrow.

Once this charge-up phenomenon exists, since the irradiation direction of the electron beam applied upon the sample is distorted by the electric charge, an object to be observed by the electron microscope cannot be accurately photographed, or noise is superposed upon the object detection signals.

To reduce the electric charge accumulated on the sample, various countermeasures have been so far proposed, for instance such that the voltage for accelerating the electron beam is lowered (low voltage method); the electron density is reduced (low doze method); the scanning speed is increased (high speed scanning method), etc. In the above-mentioned prior art methods, however, it is still extremely difficult to hold all over the scanned sample surface in an equipotential level.

One of the major reasons is that in the prior art electron beam irradiating apparatus, line scanning is repeated, except a special case as in an automatic focusing operation. In this repeated line scanning operation, as far as the conductive sample is being scanned, there exists no specific problem.

However, when the insulating sample is being scanned repeatedly, the electric charge up increases in proportion to the number of repeated scanning operation. When the scanning width is as narrow as several pixels in particular, the charged electrons can be well discharged, so that the electric charge is not accumulated, in the case of where the scanning width extends to about 50 pixels, with the result that it becomes difficult to observe the sample of insulating material.

Further, in the prior art electric signal detecting apparatus incorporated in the electron beam irradiating apparatus, when the electric signal such as photoelectric signals are integrated by the sample hold circuit in response to the pixel clock signal of the video signal within the period of the clock signal, since the number of the sample hold circuit is only one, there exists a problem in that it is impossible to integrate the photoelectric signal over a sufficient time interval within the period of the clock signal, because the same sample hold circuit must respond to the succeeding clock signal.

SUMMARY OF THE INVENTION

With these problems in mind, therefore, it is the object of the present invention to provide an electron beam irradiating apparatus and the method therefor, by which an image of a high S/N ratio can be obtained without producing the electric charge up accumulated on a sample to be observed.

Further, it is another object of the present invention to provide an electric signal detecting apparatus which can integrate the electric signals over a sufficient time interval within the period of the clock signal, to obtain a reliable video signal on the basis of the photoelectric signal generated by the electron beam irradiating apparatus.

To achieve the above-mentioned object, the present invention provides an electron beam irradiating apparatus comprising: position information signal outputting means for outputting position information signals for designating positions at which an electron beam is irradiated on a plane scanned by the electron beam in sequence, so as to designate the irradiation positions at random; and irradiation control means for controlling the electron beam to irradiate the electron beam at the irradiation positions in response to the outputted position information signals.

Further, to achieve the above-mentioned object, the present invention provides an electron beam irradiating apparatus comprising: position information signal outputting means for outputting position information signals for designating positions at which an electron beam is irradiated on a plane scanned by the electron beam in sequence, so as not to designate the adjacent irradiation positions continuously; and irradiation control means for controlling the electron beam to irradiate the electron beam at the irradiation positions in response to the outputted position information signals.

Further, to achieve the above-mentioned object, the present invention provides an electron beam irradiating method comprising the steps of: outputting position information signals for designating positions at which an electron beam is irradiated on a plane scanned by the electron beam in sequence, so as to designate the irradiation positions at random; and controlling the electron beam to irradiate the electron beam at the irradiation positions in response to the outputted position information signals.

Further, to achieve the above-mentioned object, the present invention provides an electric signal detecting apparatus comprising: a plurality of sample hold circuits for integrating electric signals in response to a clock signal over within a period of the clock; and a selecting circuit for selecting and activating said sampling hold circuits for integrating the electric signals, in sequence.

In the electron beam irradiating apparatus according to the present invention, since the scanning plane is irradiated with the electron beam at random, without irradiating the same irradiation position continuously; or alternatively in accordance with a predetermined order, without irradiating the adjacent irradiation positions continuously, it is possible to prevent electric charge up from being accumulated on the scanning surface.

Further, in the electric signal detecting apparatus according to the present invention, since a plurality of sample hold circuits are provided, and the sample hold circuits are activated in sequence by the select circuit, the respective sample hold circuits can integrate the electric signals over a sufficient time interval within the period of the clock signal.

DETAILED DESCRIPTION OF THE PREFERRED EMBODIMENTS

A first embodiment of the electron beam irradiating apparatus according to the present invention will be described hereinbelow with reference to FIG. 1.

Figure 1:
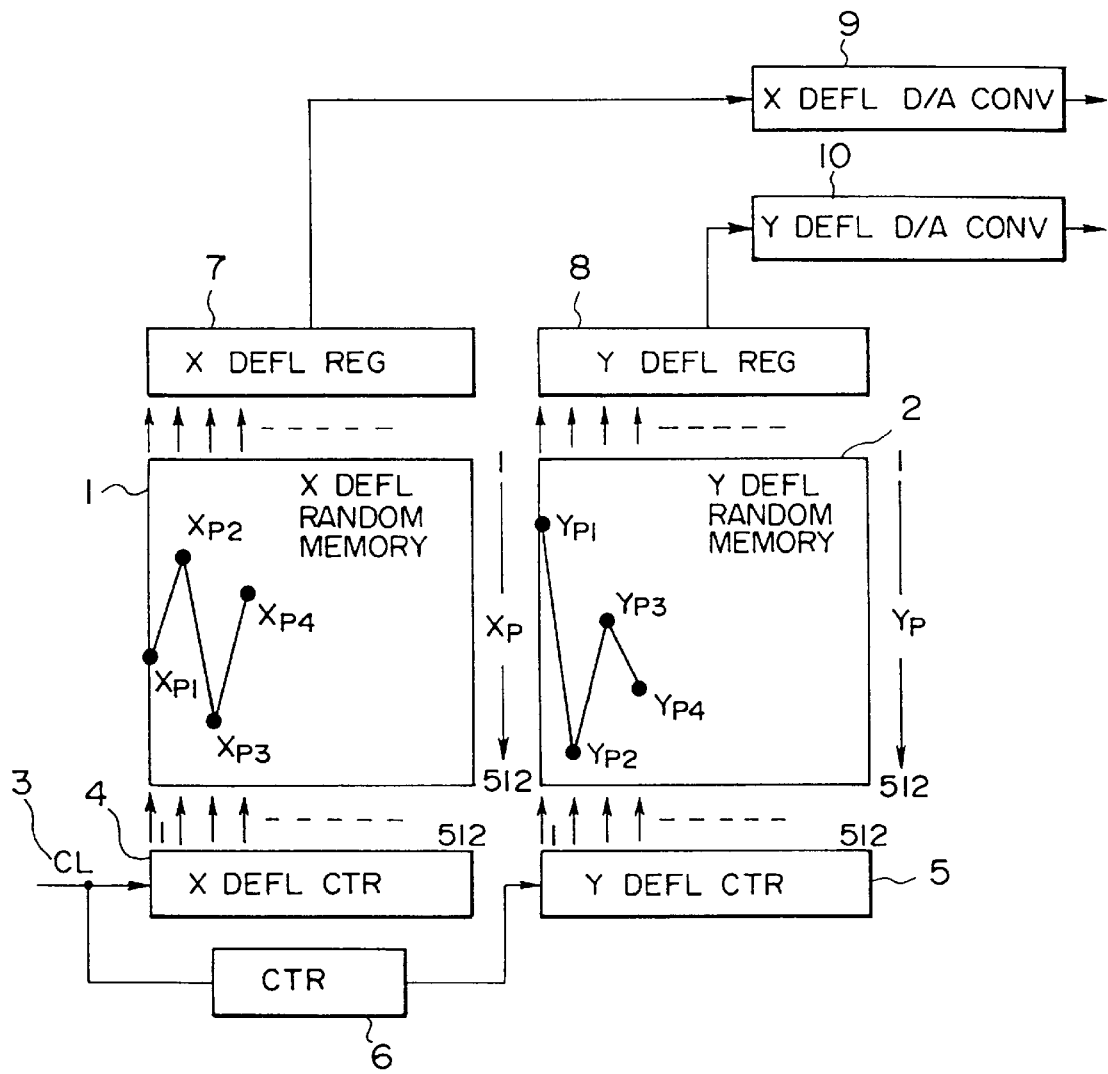
FIG. 1 is a schematic block diagram showing a first embodiment of the electron beam irradiating apparatus according to the present invention.

In FIG. 1, an x deflection memory 1 and a Y deflection memory 2 are of EPROM (erasable programmable read-only-memory) for storing random numbers $X_P$ and $Y_P$, respectively generated by random number generating means such as a host computer, for instance. These random numbers are any numbers from 1 to 512 and outputted in a random order. The X deflection memory 1 and the Y deflection memory 2 are provided with addresses from 1 to 512, to which random numbers $X_{P1}, X_{P2}, \ldots, Y_{P1}, Y_{P2}, \ldots$, outputted from the random number generating means at random are stored, respectively. In the X or Y deflection memory 1 or 2, the abscissa denotes the address number, and the ordinate denotes the random number.

A clock 3 generated from a clock generating means (not shown) is inputted to both an X deflection counter 4 and a counter 6. The X deflection counter 4 counts the number of the inputted clocks 3. On the basis of this counted value, the address is designated. A random number value $X_P$ of a data stored in the designated address is outputted to an X deflection register 7, so that the electron beam is scanned to the X axis position in response to the outputted random number, without scanning the Y axis position.

Further, when the number of clocks 3 reaches 512 beginning from 1, the counter 6 is cleared up and simultaneously the Y deflection counter 5 is counted up by one clock. On the basis of the clock number of the Y deflection counter 5, the address of the Y deflection memory 2 is designated, so that the random number value $Y_P$ of a data stored at the designated address is outputted to a Y deflection register 8. Accordingly, the electron beam is irradiated at the Y axis position shifted by the position corresponding to the next random numbers $Y_P$. As described above, when the value of the Y deflection counter 5 reaches 512, the irradiation of electron beam is completed by one frame.

The random numbers $X_P$ and $Y_P$ outputted to the X deflection register 7 and the Y deflection register 8 are D/A converted by an X deflection D/A convertor 9 and a Y deflection D/A convertor 10.

The output signals of the X deflection D/A convertor 9 and the Y deflection D/A convertor 10 are amplified by deflection amplifiers, respectively, and then inputted to a scanning coil (not shown) as a horizontal scanning signal (H. SCAN) and a vertical scanning signal (V. SCAN). The scanning coil generates deflection voltages corresponding to the random numbers $X_P$ and $Y_P$, to irradiate the electron beam at irradiation positions corresponding to the random numbers $X_P$ and $Y_P$ on the scanning plane.

Figure 4:
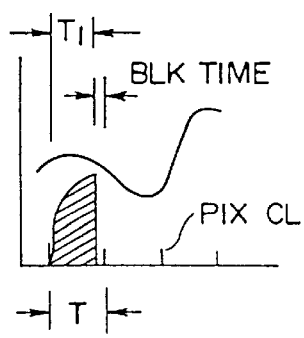
FIG. 4 is a graphical representation for assistance in explaining the integration processing by the sample hold circuit shown in FIG. 3.

Further, since the electron beam is irradiated upon the scanning plane at random, a blanking time during which the electron beam is not irradiated, as shown in FIG. 4, is provided for each time required to shift the electron beam.

Figure 2:
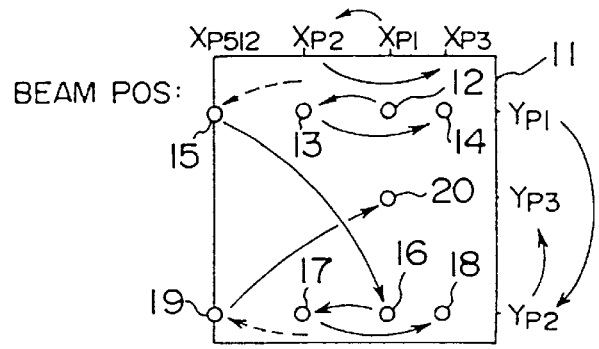
FIG. 2 is an illustration for assistance in explaining the electron beam irradiated upon the scanning plane at random, in the first embodiment of the electron beam irradiating apparatus according to the present invention.

With reference to FIG. 2, the shift motion of the irradiation position of the electron beam on the scanning plane 11 will be described. Here, the numeral 12 denotes an irradiation position at which the X axis position is $X_{P1}$ and the Y axis position is $Y_{P1}$. The electron beam is shifted from the irradiation position 12 to the irradiation position 13 with the Y axis position $Y_{P1}$ kept as it is, and then shifted finally to the irradiation position 15 via the irradiation position 14. Thereafter, the Y axis position is shifted from $Y_{P1}$ to $Y_{P2}$, and the electron beam is shifted from the irradiation position 16 to the irradiation position 19 finally via the irradiation positions 17 and 18 with the Y axis position $Y_{P2}$ kept as it is. Successively, the Y axis position is shifted from $Y_{P2}$ to $Y_{P3}$, so that the irradiation position is shifted to 20.

As described above, the electron beam is irradiated at all the irradiation positions corresponding to all the pixels of 512×512 ixels on the scanning plane 11, so that the irradiation for one frame can be completed. The above-mentioned operation is repeated in the same way.

In the construction of this embodiment, since the scanning plane is irradiated at random with the electron beam, it is possible to suppress the electric charge up accumulated on the scanning plane.

In the above-mentioned embodiment, the scanning is first made along the X axis direction with the Y axis position kept at a fixed position. Without being limited thereto, however, it is of course possible to scan both the X and Y axis positions simultaneously.

Further, the frame construction in which one frame is composed of 512×512 pixels has been explained, by way of example. Without being limited thereto, it is also possible to easily apply the present invention to such a frame construction that one frame is composed of 512×480 or 1024×1024 pixels, by simply modifying the design values to the X deflection counter 4 and the Y deflection counter 5, and modifying the memory size of te X deflection memory 1 and the Y deflection memory 2.

A second embodiment of the present invention will be described hereinbelow.

In this second embodiment, the random number generating means is not used, but position information signals for designating 1 to 512 irradiation positions are stored previously in the respective addresses of the x deflection memory 1 and the Y deflection memory 2.

The above-mentioned position information signals are so determined as not to designate two adjacent irradiation positions continuously. Further, the position information signals are arranged appropriately according to the distribution of the electrically conductive region and the electrically non-conductive regions which constitute the scanning plane, in order to prevent electric charge up from being accumulated at the electron beam irradiation positions on the scanning plane 11. In more detail, when the electrically conductive region on the scanning plane is irradiated with the electron beam, the relatively adjacent regions are irradiated collectively to reduce the load applied to the scanning coil. On the other hand, when the electrically non-conductive region is irradiated with the electron beam, the irradiation positions continuously irradiated with the electron beam is scattered. The above-mentioned irradiating method can reduce the electric charge up accumulated on the scanning plane.

Further, with respect to the arrangement of the electron beam on the basis of the position information signals, it is also preferable to previously prepare a plurality of patterns corresponding to the objects to be observed and to exchange the patterns according to the object to be observed.

In the construction of the above-mentioned embodiment, it is possible to determine appropriate irradiation conditions according to the pattern of an object to be observed, for preventing electric charge up from being accumulated on the scanning plane.

A third embodiment of the present invention described hereinbelow with reference to FIGS. 3 to 6, which relates to an electric signal detecting apparatus incorporated in the electron beam irradiating apparatus according to the present invention. The electric signal detecting apparatus is used to obtain a video signal on the basis of the photoelectric signal obtained by the electron beam irradiating apparatus.

Figure 5:
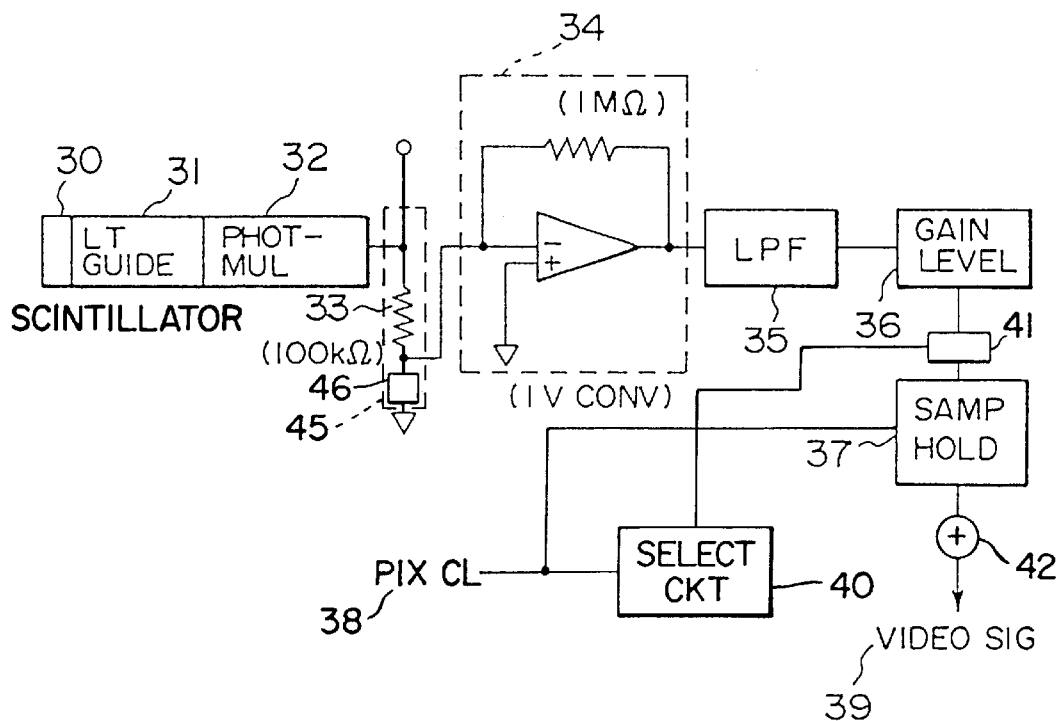
FIG. 5 is a schematic block diagram showing a practical electric signal detecting apparatus of the third embodiment according to the present invention.

FIG. 5 shows an ordinary electric signal detecting circuit for generating a video signal on the basis of secondary electrons emitted by irradiating the scanning plane with an electron beam generated by an electron beam irradiating apparatus.

In FIG. 5, the secondary electrons are transformed into a light signal by a scintillator 30. The transformed light signal is introduced via a light guide 31 to a photomultiplier 32 by which the light signal is transduced into an electric signal and further the transduced signal is amplified. The current output signal of the photomultiplier 32 is further amplified and converted into a voltage signal by a charge amplifier including a resistor 33, and a current-voltage converting circuit 34. The output signal of the current-voltage converting circuit 34 is passed through a low-pass filter 35 to remove high frequency noise, further passed through an amplifier 36 to regulate the gain level, and then inputted to a sample hold circuit 37.

Figure 6:
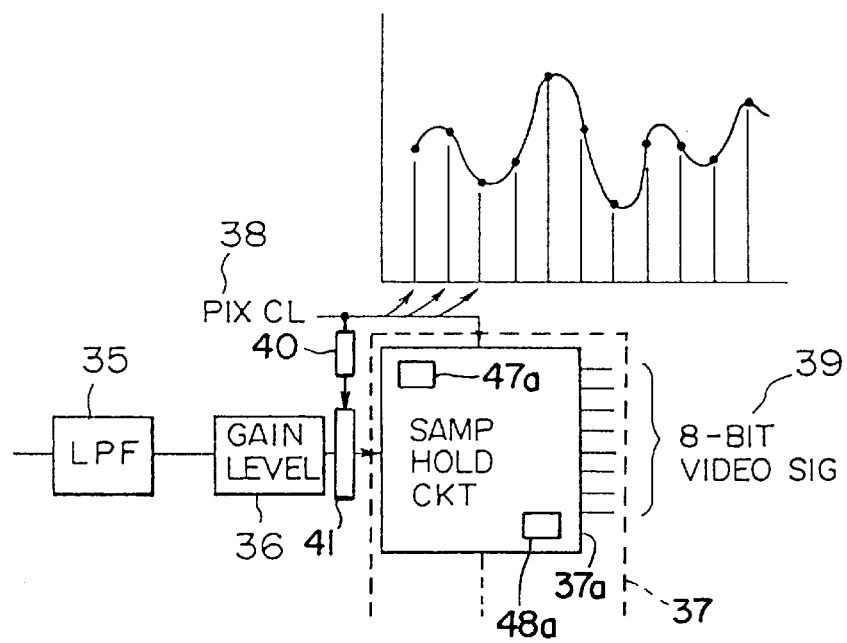
FIG. 6 is a partial block diagram showing the general function of the sample hold circuit of the third embodiment according to the present invention.

As depicted in FIG. 6, the sample hold circuit 37 integrates the output signal of the amplifier 36 over the time interval within the period of the clock signal in response to a pixel clock 38 for prescribing the pixels of a video signal 39, to output the video signal 39 of 8 bits.

Figure 3:
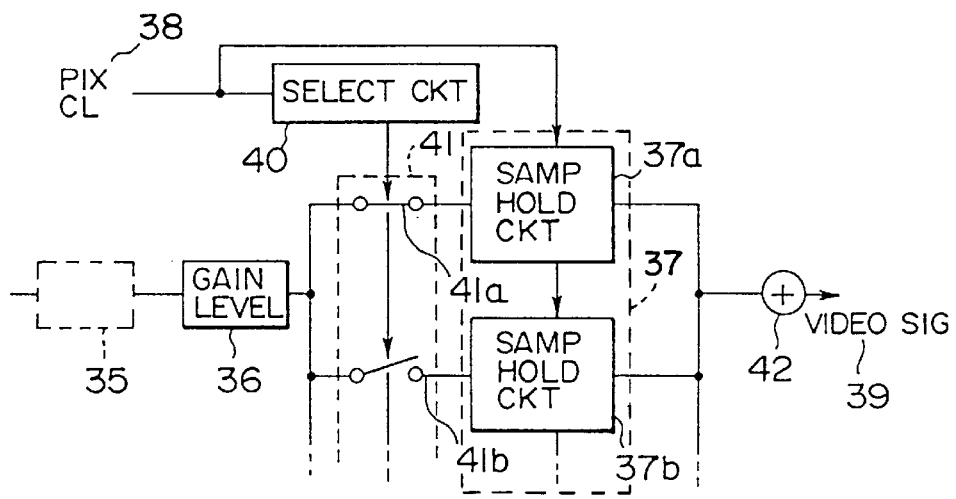
FIG. 3 is a partial block diagram showing a third embodiment of the electric signal detecting apparatus according to the present invention.

In this embodiment, the sample hold circuit 37 is composed of a plurality of sample hold circuits 37a, 37b, . . . as shown in FIG. 3.

In FIG. 3, a selecting circuit 40 activates the sample hold circuits 37a, 37b, . . . in sequence, respectively via respective switching means 41a, 41b, . . . whenever one pixel clock 38 is inputted to the selecting circuit 40. The sample hold circuits 37a, 37b, . . . integrate the output signal of the amplifier 36 during an integration time T determined on the basis of the electron beam irradiated time. The integrated signal is A/D converted into a video signal of 8 bits representative of 256 gray levels, for instance. The video signal outputted from the respective sample hold circuits 37a, 37b, . . . are added through an adder 42 and then outputted finally as a video signal 39.

The operation of the present embodiment will be described hereinbelow. In response to the pixel clock, the selecting circuit 40 closes any one of the switch means 41, for instance only the switch 41a to activate only the sample hold circuit 37a connected to the closed switch 41a.

As depicted in FIG. 4, the sample hold circuit 37a integrates the output of the gain level amplifier 36 over the integration time TI within the period T of the pixel clock 38. It is preferable to determine this integration time $T_I$ as long as possible within the period T of the pixel clock 38, in order to average the statistic error of counting of the emitted secondary electrons and further to improve the S/N ratio. Therefore, the integration time $T_I$ is determined so as to satisfy the condition as $T_I=T-T_B$, where $T_B$ denotes a blanking time required to shift the electron beam to another irradiation position.

After having been integrated within the integration time $T_I$, the input signal of the sample hold circuit 37a is outputted through the adder 42. After the integration time $T_I$ has elapsed, when a holding circuit of the sample hold circuit 37a is turned off, a discharge circuit is turned on, so that the sample held signal is discharged. In the present invention, it is not required that the sample hold circuit 37a be activated in response to the succeeding pixel clock 38; in other words, it is unnecessary to complete the discharge within the period T of the pixel clock 38. Therefore, it is possible to determine the integration time $T_I$ freely, as far as $T_I=T-T_B$ is satisfied, thus enabling the integration time $T_I$ to be determined longer than is conventional.

Successively, when the succeeding pixel clock 38 is inputted, the selecting circuit 40 activates only the sample hold circuit 37b. In the same way as described above, the sample hold circuits are activated in sequence, repeatedly.

In the construction of the present invention, since a plurality of sample hold circuits are activated in sequence, each of the sample hold circuits can integrate the electric signal over a sufficient time interval within the period of the clock signal.

As a result, it is possible to remove noise difficult to prevent in the case of instantaneous sampling operations or short time integrations, so that the S/N ratio can be improved. In addition, since no low-pass filter is required, images of higher S/N ratio can be obtained.

Further, since the statistic factor of the secondary electrons emitted when the electron beam irradiated can be averaged sufficiently, signals of higher reliability can be generated.

As described above, in the electron beam irradiating apparatus according to the present invention, since the irradiation positions on the scanning plane are irradiated with the electron beam at random, it is possible to prevent the scanning plane from being charged up.

Further, since a plurality of sample hold circuits are provided so as to be activated in sequence by the selecting circuit, it is possible to integrate the electric signal over a sufficient time interval within the period of the clock signal.

What is claimed is:

1. An electrical signal detecting apparatus, comprising:

a plurality of sample hold circuits for integrating over an integrating time $T_I$ a second electrical signal representative of a first electrical signal produced by an electrical signal producing device; and a selecting circuit for selecting and activating, in response to a clock pulse of a clock signal having a clock period T, a sample hold circuit of said plurality of sample hold circuits;

said integrating time $T_I$ being approximately equal to said period clock T less a blanking period $T_B$ of said electrical signal producing device.

2. The apparatus of claim 1, further comprising:

a discharge circuit for discharging said one sample hold circuit upon expiration of said integrating time $T_I$.

3. The apparatus of claim 1, wherein said selecting circuit comprises means for sequentially selecting and activating individual sample hold circuits of said plurality of sample hold circuits in response to sequential pulses of said clock signal.

4. An apparatus for producing a video signal representative of photoelectric emissions produced by an object irradiated by a scanning electron beam, comprising:

a plurality of sample hold circuits for integrating over an integrating time $T_I$ an electrical signal representative of secondary electrons emitted from said object at a point of irradiation; and a selecting circuit for selecting and activating, in response to a clock pulse of a clock signal having a clock period T, one sample hold circuit of said plurality of sample hold circuits;

said integrating time $T_I$ being approximately equal to said clock period T less a blanking period $T_B$ of said device.

5. The apparatus of claim 4, further comprising:

a discharge circuit for discharging said one sample hold circuit upon expiration of said integrating time $T_I$.

6. The apparatus of claim 4, wherein said selecting circuit comprises means for sequentially selecting and activating individual sample hold circuits of said plurality of sample hold circuits in response to sequential pulses of said clock signal.

* * * * *